United States Patent
Ogawa et al.

(10) Patent No.: US 7,808,821 B2
(45) Date of Patent: Oct. 5, 2010

(54) NONVOLATILE SEMICONDUCTOR MEMORY INCLUDING MEMORY CELL FOR STORING MULTILEVEL DATA HAVING TWO OR MORE VALUES

(75) Inventors: Mikio Ogawa, Yokohama (JP);
Katsuaki Isobe, Yokohama (JP);
Yoshikazu Takeyama, Fujisawa (JP);
Mitsuaki Honma, Yokohama (JP);
Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 194 days.

(21) Appl. No.: 12/204,207

(22) Filed: Sep. 4, 2008

(65) Prior Publication Data
US 2009/0067255 A1    Mar. 12, 2009

(30) Foreign Application Priority Data
Sep. 7, 2007    (JP)    ............... 2007-233231

(51) Int. Cl.
*G11C 16/04*    (2006.01)
(52) U.S. Cl. ............... 365/185.03; 365/185.22
(58) Field of Classification Search ............ 365/185.03, 365/185.22, 185.17, 185.28
See application file for complete search history.

(56) References Cited

U.S. PATENT DOCUMENTS

| | | | |
|---|---|---|---|
| 5,986,929 A | * | 11/1999 | Sugiura et al. ......... 365/185.03 |
| 6,400,601 B1 | | 6/2002 | Sudo et al. |
| 6,545,909 B2 | * | 4/2003 | Tanaka et al. .......... 365/185.03 |
| 6,707,719 B2 | | 3/2004 | Shibata et al. |
| 7,301,817 B2 | | 11/2007 | Li et al. |

FOREIGN PATENT DOCUMENTS

JP    2003-196988    7/2003

OTHER PUBLICATIONS

U.S. Appl. No. 11/780,656, filed Jul. 20, 2007, Noboru Shibata.

* cited by examiner

*Primary Examiner*—Vu A Le
(74) *Attorney, Agent, or Firm*—Oblon, Spivak, McClelland, Maier & Neustadt L.L.P.

(57) ABSTRACT

A write controller performs verification for checking whether each memory cell is on a predetermined verification level. For a memory cell to be written to a voltage level higher than the predetermined verification level, the write controller stores, in first and second latch circuits, the number of times of write to be performed by a write voltage after the verification. Whenever write is performed by the write voltage, the write controller updates the number of times of write stored in the first and second latch circuits. After write is performed the number of times of write by the write voltage, the write controller performs write by an intermediate voltage lower than the write voltage.

12 Claims, 10 Drawing Sheets

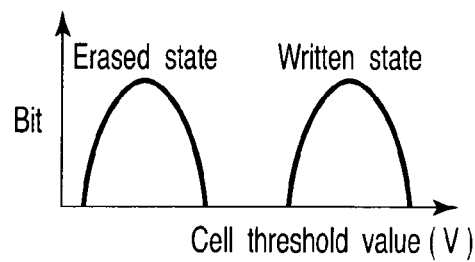
F I G. 1
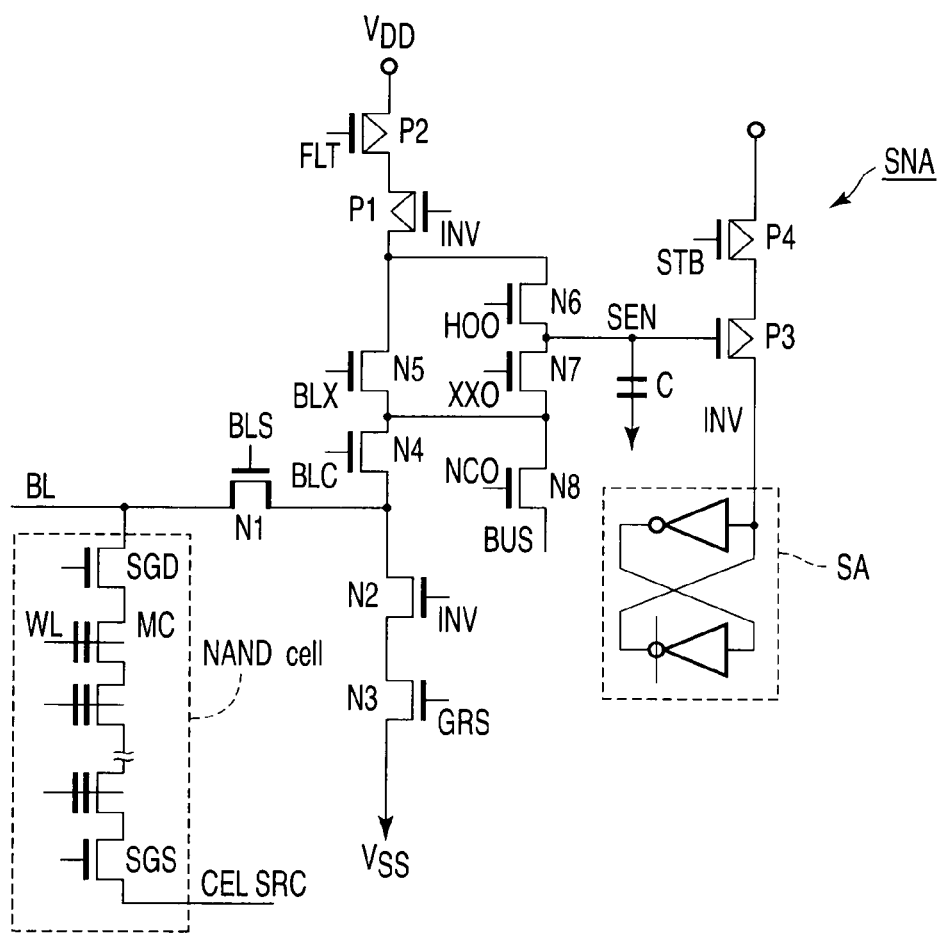
F I G. 2

| Write level | LATAQ | LATA | LATB | Number of programming operations |
|---|---|---|---|---|
| A initialization | "0" | "0" | "0" | 0 |
| B increment | "1" | "0" | "0" | 0.5 |
| C increment | "0" | "1" | "0" | 1 |
| B initialization | "1" | "1" | "0" | 1.5 |
| C initialization | "0" | "0" | "1" | 2 |
|  | "1" | "1" | "1" | Non - write |

| Incrementing operation | Calculation algorithm |
|---|---|
| 0 times→Non-write | bLATA and bLATB and bLATQ and SA→LATA, LATB, LATQ |
| 0.5 times→0 times | b(bLATA and LATQ and SA)→LATQ |
| 1 time→0 times | bLATA or LATB or bSA→LATA |
| 2 times→1 time | bLATA and LATB and SA→LATA, LATA or bLATB or bSA→LATB |
FIG. 14
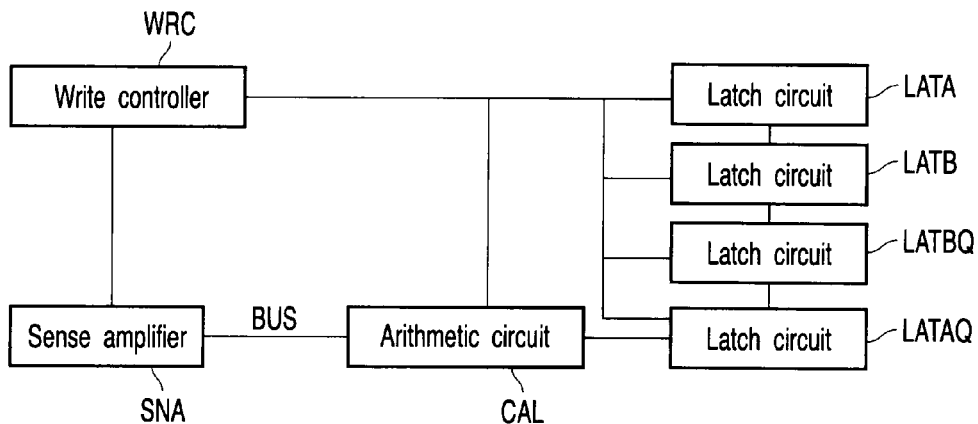
FIG. 15
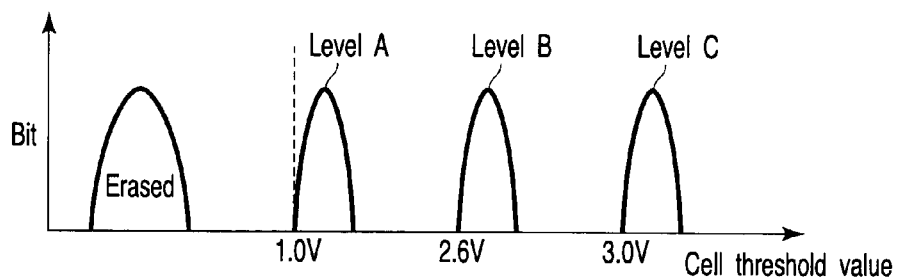
FIG. 16

| Write level | LATAQ | LATBQ | LATA | LATB | Number of programming operations |
|---|---|---|---|---|---|
| A initialization | "0" | "0" | "0" | "0" | 0 |
| B increment | "1" | "0" | "0" | "0" | 0.3×1 |
| B increment | "0" | "1" | "0" | "0" | 0.3×2 |
| C increment | "0" | "0" | "1" | "0" | 1 |
| B initialization | "0" | "1" | "1" | "0" | 1+0.3×2 |
| C initialization | "0" | "0" | "0" | "1" | 2 |
| | "1" | "1" | "1" | "1" | Non-write |

FIG. 17

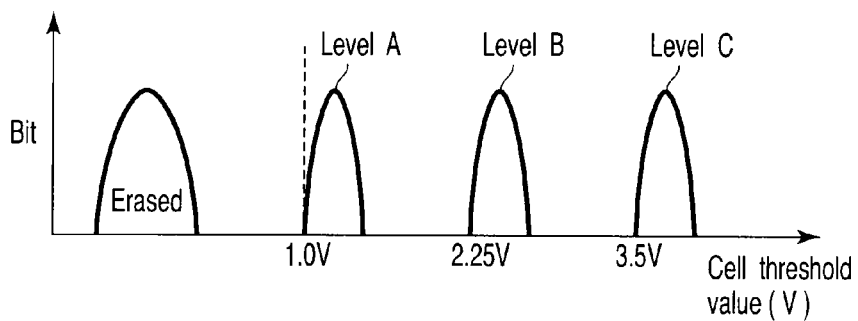

FIG. 19

| Write level | LATAQ | LATBQ | LATA | LATB | Number of programming operations |
|---|---|---|---|---|---|
| A initialization | "0" | "0" | "0" | "0" | 0 |
| B increment | "1" | "0" | "0" | "0" | 0.25 |
| C increment | "0" | "1" | "0" | "0" | 0.5 |
| B initialization | "1" | "0" | "1" | "0" | 1+0.25 |
| C increment | "0" | "1" | "1" | "0" | 1+0.5 |
| C initialization | "0" | "1" | "0" | "1" | 2+0.5 |
| | "1" | "1" | "1" | "1" | Non-write |

FIG. 20

| Incrementing operation | Calculation algorithm |
|---|---|
| 0 times→Non - write | bLATA and bLATB and bLATAQ and bLATBQ and SA → LATA, LATB, LATAQ, LATBQ |
| 0.3 times→0 times | b ( bLATA and LATAQ and bLATBQ and SA ) → LATAQ |
| 0.3 times×2→0.3 times | bLATA and LATBQ and SA → LATAQ, b ( bLATA and LATBQ and SA ) → LATBQ |
| 1 time→0 times | bLATA or LATB or bSA → LATA |
| 2 times→1 time | bLATA and LATB and SA → LATA, LATA or bLATB or bSA → LATB |

FIG. 18

| Incrementing operation | Calculation algorithm |
|---|---|
| 0 times→Non - write | bLATA and bLATB and bLATAQ and bLATBQ and SA → LATA, LATB, LATAQ, LATBQ |
| 0.5 times→0 times | b ( bLATA and LATAQ and SA ) → LATAQ |
| 0.25 times→0 times | b ( bLATA and LATBQ and SA ) → LATBQ |
| 1 time→0 times | bLATA or bLATB or bSA → LATA |
| 2 times→1 time | bLATA and LATB and SA → LATA, LATA or bLATB or bSA → LATB |

FIG. 21

NONVOLATILE SEMICONDUCTOR MEMORY INCLUDING MEMORY CELL FOR STORING MULTILEVEL DATA HAVING TWO OR MORE VALUES

CROSS-REFERENCE TO RELATED APPLICATIONS

This application is based upon and claims the benefit of priority from prior Japanese Patent Application No. 2007-233231, filed Sep. 7, 2007, the entire contents of which are incorporated herein by reference.

BACKGROUND OF THE INVENTION

1. Field of the Invention

The present invention relates to a nonvolatile semiconductor memory, e.g., a NAND electrically erasable and programmable ROM (EEPROM) having a control gate and floating gate and including a memory cell for storing multilevel data having two or more values.

2. Description of the Related Art

In a write operation of a NAND EEPROM, a verification operation (read operation) for verifying whether data is written in a memory cell is performed after a programming operation. When writing only binary data in a memory cell, only one read operation is necessary for one programming operation. However, three read operations are necessary when writing quaternary data in a memory cell, and seven read operations are necessary when writing octernary data in a memory cell. That is, read operations corresponding to each level are necessary, and this prolongs the write time.

Note that as prior art relevant to the present invention, a nonvolatile semiconductor memory has been proposed which comprises a write circuit which writes data in a memory cell by supplying a write voltage Vpgm and write control voltage VBL to the memory cell, writes data in the memory cell by changing the value of the write control voltage VBL when the memory cell has reached a first written state, and inhibits write to the memory cell by changing the value of the write control voltage VBL to Vdd when the memory cell has reached a second written state (e.g., Jpn. Pat. Appln. KOKAI Publication No. 2003-196988).

BRIEF SUMMARY OF THE INVENTION

According to a first aspect of the present invention, there is provided a nonvolatile semiconductor memory comprising a plurality of electrically programmable memory cells; a first latch circuit and a second latch circuit which store the number of times of write to be performed using a write voltage for each memory cell; a third latch circuit which stores data indicating whether to perform write by using an intermediate voltage lower than the write voltage; a fourth latch circuit which stores, for each memory cell, data indicating whether the memory cell has passed predetermined verification; an arithmetic circuit which, whenever write is performed by one of the write voltage and the intermediate voltage, performs a calculation by using the data stored in the first latch circuit, the second latch circuit, the third latch circuit, and the fourth latch circuit, and updates the data stored in the first latch circuit, the second latch circuit, and the third latch circuit; a sense amplifier which performs write by one of the write voltage and the intermediate voltage for each memory cell, in accordance with the data stored in the first latch circuit, the second latch circuit, and the third latch circuit; and a write controller which controls operations of the first latch circuit, the second latch circuit, the third latch circuit, the fourth latch circuit, the arithmetic circuit, and the sense amplifier. The write controller performs predetermined verification for each memory cell, and stores data indicating whether the memory cell has passed the predetermined verification in the fourth latch circuit, stores the number of times of write to be performed by the write voltage after the verification in the first latch circuit and the second latch circuit, and stores data indicating whether to perform write by the intermediate voltage in the third latch circuit, for a memory cell to be written to a voltage level higher than a voltage level of the predetermined verification, updates the number of times of write stored in the first latch circuit and the second latch circuit, whenever write is performed by the write voltage, and determines write by the intermediate voltage in accordance with the data stored in the third latch circuit, after write is performed the number of times of write by the write voltage.

According to a second aspect of the present invention, there is provided a nonvolatile semiconductor memory comprising a plurality of electrically programmable memory cells; a first latch circuit and a second latch circuit which store the number of times of write to be performed using a write voltage for each memory cell; a third latch circuit and a fourth latch circuit which store the number of times of write to be performed using an intermediate voltage lower than the write voltage; a fifth latch circuit which stores, for each memory cell, data indicating whether the memory cell has passed predetermined verification; an arithmetic circuit which, whenever write is performed by one of the write voltage and the intermediate voltage, performs a calculation by using the data stored in the first latch circuit, the second latch circuit, the third latch circuit, the fourth latch circuit, and the fifth latch circuit, and updates the data stored in the first latch circuit, the second latch circuit, the third latch circuit, and the fourth latch circuit; a sense amplifier which performs write by one of the write voltage and the intermediate voltage for each memory cell, in accordance with the data stored in the first latch circuit, the second latch circuit, the third latch circuit, and the fourth latch circuit; and a write controller which controls operations of the first latch circuit, the second latch circuit, the third latch circuit, the fourth latch circuit, the fifth latch circuit, the arithmetic circuit, and the sense amplifier. The write controller performs predetermined verification for each memory cell, and stores data indicating whether the memory cell has passed the predetermined verification in the fifth latch circuit, stores the number of times of write to be performed by the write voltage after the verification in the first latch circuit and the second latch circuit, and stores the number of times of write to be performed by the intermediate voltage in the third latch circuit and the fourth latch circuit, for a memory cell to be written to a voltage level higher than a voltage level of the predetermined verification, updates the number of times of write stored in the first latch circuit and the second latch circuit, whenever write is performed by the write voltage, and performs write by the intermediate voltage in accordance with the number of times of write stored in the third latch circuit and the fourth latch circuit, after write is performed the number of times of write by the write voltage.

According to a third aspect of the present invention, there is provided a nonvolatile semiconductor memory comprising a plurality of electrically programmable memory cells; a first latch circuit and a second latch circuit which store the number of times of write to be performed using a write voltage for each memory cell; a third latch circuit which stores the number of times of write to be performed using a first intermediate voltage lower than the write voltage; a fourth latch circuit which stores the number of times of write to be performed using a second intermediate voltage lower than the write voltage and higher than the first intermediate voltage; a fifth latch circuit which stores, for each memory cell, data indicating whether the memory cell has passed predetermined verification; an arithmetic circuit which, whenever write is performed by one of the write voltage, the first intermediate voltage, and the second intermediate voltage, performs a calculation by using the data stored in the first latch circuit, the second latch circuit, the third latch circuit, the fourth latch circuit, and the fifth latch circuit, and updates the data stored in the first latch circuit, the second latch circuit, the third latch circuit, and the fourth latch circuit; a sense amplifier which performs write by one of the write voltage, the first intermediate voltage, and the second intermediate voltage for each memory cell, in accordance with the data stored in the first latch circuit, the second latch circuit, the third latch circuit, and the fourth latch circuit; and a write controller which controls operations of the first latch circuit, the second latch circuit, the third latch circuit, the fourth latch circuit, the fifth latch circuit, the arithmetic circuit, and the sense amplifier. The write controller performs predetermined verification for each memory cell, and stores data indicating whether the memory cell has passed the predetermined verification in the fifth latch circuit, stores the number of times of write to be performed by the write voltage after the verification in the first latch circuit and the second latch circuit, stores the number of times of write to be performed by the first intermediate voltage in the third latch circuit, and stores the number of times of write to be performed by the second intermediate voltage in the fourth latch circuit, for a memory cell to be written to a voltage level higher than a voltage level of the predetermined verification, updates the number of times of write stored in the first latch circuit and the second latch circuit, whenever write is performed by the write voltage, and performs write by at least one of the first intermediate voltage and the second intermediate voltage in accordance with the numbers of times of write stored in the third latch circuit and the fourth latch circuit, after write is performed the number of times of write by the write voltage.

BRIEF DESCRIPTION OF THE SEVERAL VIEWS OF THE DRAWING

FIG. 1 is a graph showing the threshold distribution of a memory cell having binary data;

FIG. 2 is a circuit diagram of a sense amplifier to be used when writing binary data in a memory cell;

FIG. 14 is a view showing an algorithm for incrementing the latch circuit stored data according to the first embodiment;

FIG. 15 is a block diagram showing the arrangement of a nonvolatile semiconductor memory according to the second embodiment of the present invention;

FIG. 16 is a graph showing the threshold distribution of a memory cell having quaternary data according to the second embodiment;

FIG. 17 is a view showing latch circuit stored data corresponding to the number of programming operations according to the second embodiment;

FIG. 18 is a view showing an algorithm for incrementing the latch circuit stored data according to the second embodiment;

FIG. 19 is a graph showing the threshold distribution of a memory cell having quaternary data according to the third embodiment of the present invention;

FIG. 20 is a view showing latch circuit stored data corresponding to the number of programming operations according to the third embodiment;

FIG. 21 is a view showing an algorithm for incrementing the latch circuit stored data according to the third embodiment.

DETAILED DESCRIPTION OF THE INVENTION

Techniques relevant to the present invention will be explained below before the explanation of embodiments of the present invention.

When writing data in a NAND EEPROM, electrons are injected into the floating gate by applying a write voltage to a selected word line corresponding to a memory cell in an erased state, thereby increasing the threshold value of the memory cell. When the memory cell can hold binary data, as shown in FIG. 1, the threshold distribution of the memory cell has only two states, i.e., an erased state and written state.

Figure 3:
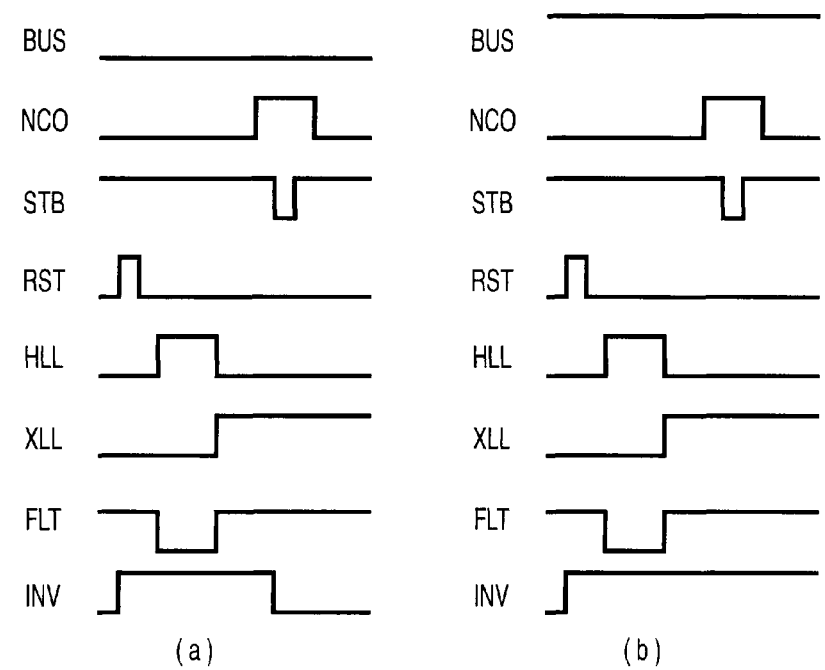
FIG. 3 is a timing chart when transferring write data to the sense amplifier.
Figure 4:
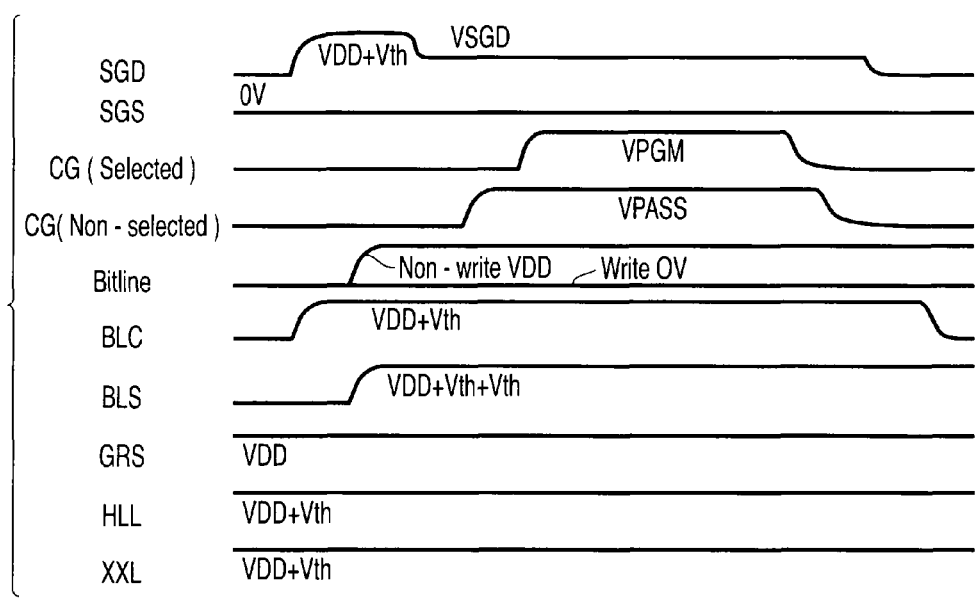
FIG. 4 is a timing chart when writing binary data in a memory cell.

First, a write operation when writing binary data in a memory cell will be explained. FIG. 2 is a circuit diagram of a sense amplifier SNA which includes a NAND cell and is used when writing binary data. FIGS. 3A and 3B are timing charts when transferring write data to the sense amplifier. FIG. 3A is a timing chart when not writing data. FIG. 3B is a timing chart when writing data. FIG. 4 is a timing chart when writing binary data.

The circuit configuration of the sense amplifier SNA shown in FIG. 2 will be described below. The NAND cell has a plurality of memory cells MC, and selection gates SGD and SGS. The memory cells MC are connected in series by their current paths. The selection gate SGD is connected to one terminal of the series circuit of the memory cells. The selection gate SGS is connected to the other terminal of the series circuit of the memory cells. Each memory cell MC has a floating gate and control gate. A word line WL is connected to each control gate.

A common source line CELSRC is connected to the selection gate SGS, and a bit line BL is connected to the selection gate SGD. The bit line BL is connected to a ground potential VSS terminal via n-channel MOS transistors (to be referred to as nMOS transistors hereinafter) N1, N2, and N3. The node between the nMOS transistors N1 and N2 is connected to a power supply voltage VDD terminal via nMOS transistors N4 and N5 and p-channel MOS transistors (to be referred to as pMOS transistors hereinafter) P1 and P2.

The drain of the nMOS transistor N5 is connected to a bus BUS via nMOS transistors N6, N7, and N8. The node between the nMOS transistors N4 and N5 is connected to that between the nMOS transistors N7 and N8.

The node between the nMOS transistors N6 and N7 is connected to the gate of a pMOS transistor P3. The gate of the pMOS transistor P3 is connected to the ground potential VSS terminal via a capacitor C. The source of the pMOS transistor P3 is connected to the power supply voltage VDD terminal via a pMOS transistor P4. A latch circuit SA is connected to the drain of the pMOS transistor P3.

A signal BLS is input to the nMOS transistor N1. A signal INV is input to the gate of the nMOS transistor N2. A signal GRS is input to the gate of the nMOS transistor N3. A signal BLC is input to the gate of the nMOS transistor N4. A signal BLX is input to the gate of the nMOS transistor N5. A signal H00 is input to the gate of the nMOS transistor N6. A signal XX0 is input to the gate of the nMOS transistor N7. A signal NCO is input to the gate of the nMOS transistor N8. The signal INV is input to the gate of the pMOS transistor P1. A signal FLT is input to the gate of the pMOS transistor P2. A signal SEN is input to the gate of the pMOS transistor P3. A signal STB is input to the gate of the pMOS transistor P4.

In this circuit, the signal NCO is initially set at the power supply voltage VDD. The bus BUS supplies a high when writing data, and a low when not writing data. Also, the signal STB changes in the order of high→low→high, and write data is input to the latch circuit SA (FIGS. 3A and 3B).

In a programming operation, the selection gate SGD is set at a voltage of VDD+Vth. Subsequently, nMOS transistor N1 to which the signal BLS is input is turned on to apply 0 V to a write bit line, and apply the power supply voltage VDD to a non-write bit line. After that, the selection gate SGD is set at a voltage VSGD lower than VDD+Vth and higher than Vth+$\alpha$. In addition, a selected word line (CG) is set at a write voltage VPGM, and a non-selected word line (CG) is set at a voltage VPASS.

When writing data, the transistor of the selection gate SGD transfers 0 V (the bit line voltage). Therefore, the voltage difference between the channel and floating gate of a write cell becomes the voltage VPGM, so electrons are injected into the floating gate of the write cell. When not writing data, the transistor of the selection gate SGD is cut off, and the channel of the transistor of the memory cell rises to VDD+VPGM×Constant (<1) by coupling. Since the voltage difference between the channel and floating gate is small, no electrons are injected into the floating gate. After that, the selected word line and non-selected word line are set at 0 V, the selection gate SGD is set at 0 V, and the bit line is discharged to 0 V, thereby completing the programming operation.

Figure 5:
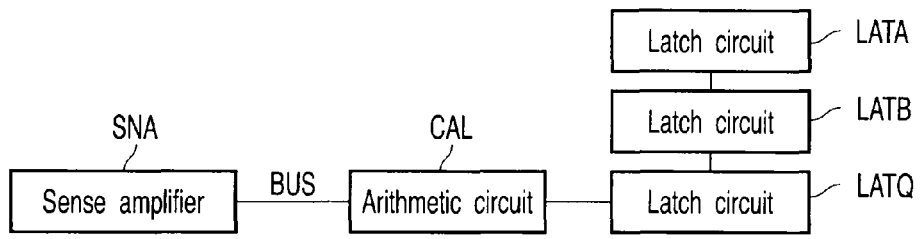
FIG. 5 is a block diagram of a memory including a sense amplifier to be used when writing quaternary data in a memory cell.

A write operation when writing quaternary data in a memory cell will now be explained. FIG. 5 is a block diagram of a memory including a sense amplifier to be used when writing quaternary data. This memory comprises a sense amplifier SNA including a NAND cell similar to that for binary data shown in FIG. 2, latch circuits LATA and LATB for storing data for setting a voltage level to which a memory cell is to be written, a latch circuit LATQ for storing data for setting whether to perform write (e.g., quick pass write) in a memory cell by supplying a predetermined intermediate voltage to a bit line, and an arithmetic circuit CAL for performing a calculation to determine whether a memory cell is written to a predetermined voltage level.

Figure 6:
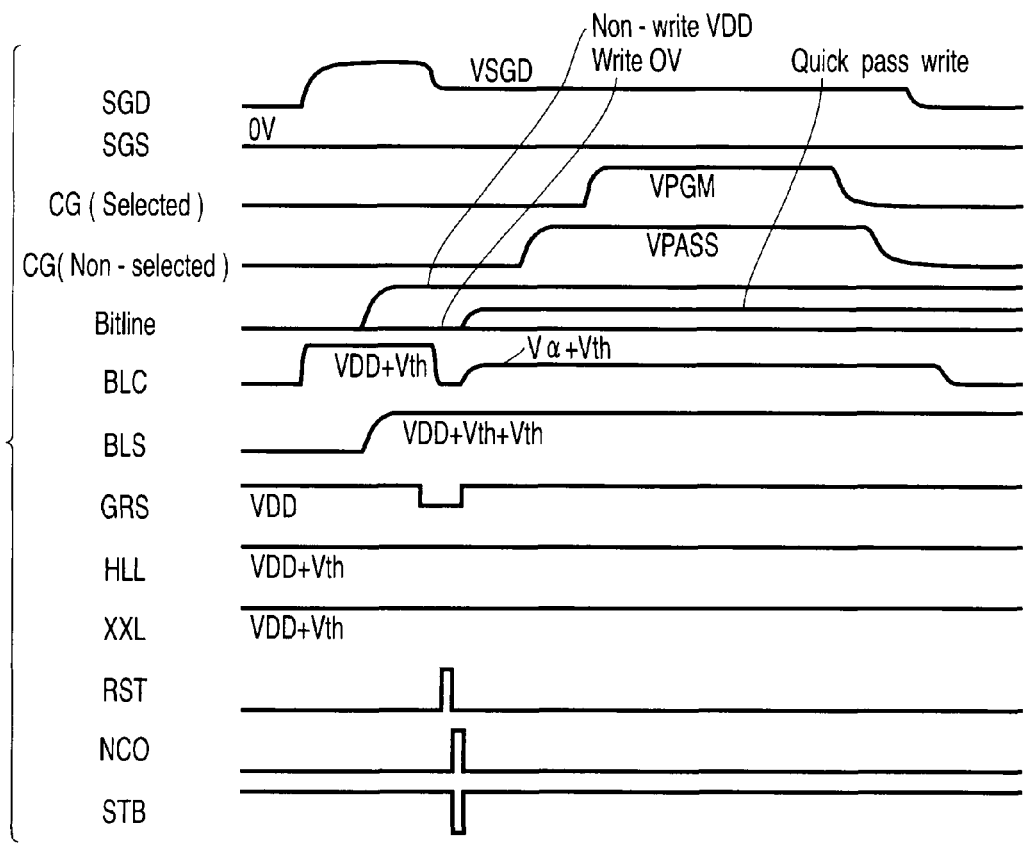
FIG. 6 is a timing chart when writing quaternary data in a memory cell.

A quaternary data write operation will be explained below with reference to FIG. 6. FIG. 6 is a timing chart when writing quaternary data. The operation is the same as the binary data write operation until the step of setting the selection gate SGD at the voltage VSGD. After that, the signal BLC changes from VDD+Vth to zero, and the latch circuit LATQ outputs its information to the bus BUS through the arithmetic circuit CAL. The signal NCO changes to the power supply voltage VDD, and the signal INV goes low for a bit for which the write voltage must be decreased and for a non-write bit.

After that, the signal BLC changes to V$\alpha$+Vth, and a voltage V$\alpha$ is transferred to the channel of the memory cell via the bit line BL. A selected word line is set at the voltage VPGM, and a non-selected word line is set at the voltage VPASS. The voltage difference between the channel and floating gate of a write cell becomes the voltage VPGM, so electrons are injected into the floating gate. The voltage difference between the channel and floating gate of a non-write cell becomes VDD+VPGM×Constant (<1)−VPGM. Since the voltage difference is small, no electrons are injected into the floating gate.

When performing quick pass write, the voltage V$\alpha$ is charged to the bit line BL, so the selection gate SGD transfers the voltage V$\alpha$ to the channel of a memory cell. The channel of the memory cell as an object of quick pass write is set at the voltage V$\alpha$, and the voltage difference between the channel and floating gate becomes VPGM−V$\alpha$. Since the voltage difference is smaller than that of a write cell, the amount of electrons injected into the floating gate decreases. This makes the threshold value of the memory cell having undergone quick pass write smaller than that of the write cell.

Figure 7:
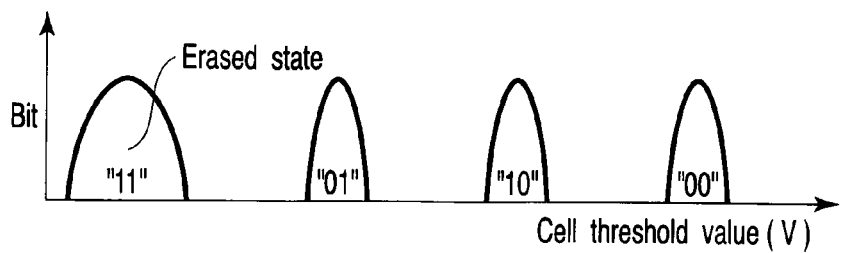
FIG. 7 is a graph showing the threshold distribution of a memory cell having quaternary data.
Figure 8:
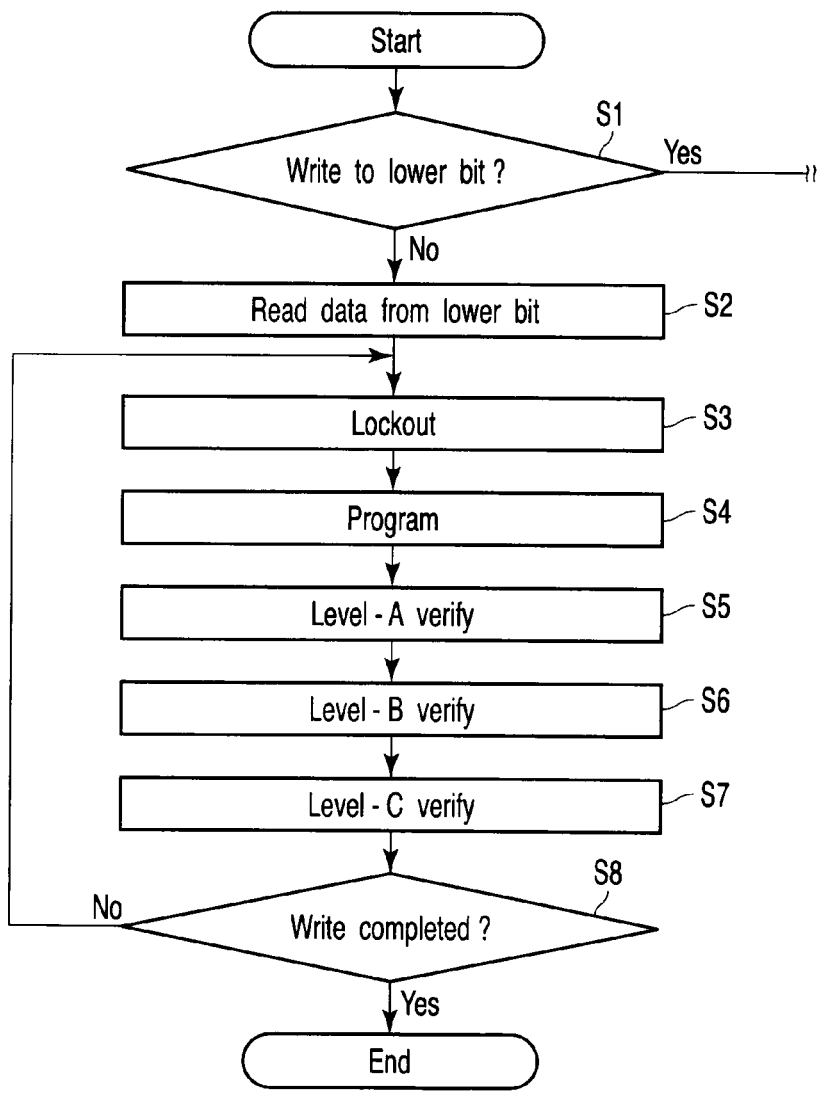
FIG. 8 is a flowchart showing a write sequence when writing quaternary data in a memory cell.

As shown in FIG. 7, quaternary data has three states in addition to the erased state, so the data must be finally written in the threshold values of three cells. A write sequence for an upper bit of quaternary data will be explained below with reference to FIG. 8. FIG. 8 shows a write sequence when writing quaternary data in a memory cell.

When writing data in an upper bit, whether to write the data in a lower bit is first determined. If the data is to be written in a lower bit, the sequence advances to a step that is not shown. On the other hand, if the data is not to be written in a lower bit, the sequence advances to step S2 (step S1). In step S2, data is read from a lower bit, and inverted data of the read data is input to the latch circuit LATB. Write data is already stored in the latch circuit LATA. LATA AND LATB is obtained from the data stored in the latch circuits LATA and LATB, and the arithmetic circuit CAL performs a calculation on the inverted data. The calculation result is input to the latch circuit SA of the sense amplifier SAN before programming through a transistor whose gate receives the signal NCO (step S3).

Then, programming shown in FIG. 6 is performed (step S4), and level-A verification (step S5), level-B verification (step S6), and level-C verification (step S7) are performed. After that, the data in the latch circuits LATA and LATB corresponding to the written bit is changed to 1.

Subsequently, whether the latch circuits LATA and LATB corresponding to all bits are 1 is sensed (step S8). If the latch circuits LATA and LATB corresponding to all bits are 1, it is determined that data write is completed, so the write operation is terminated. On the other hand, if the latch circuits LATA and LATB corresponding to all bits are not 1, it is determined that data write is not completed. Accordingly, the sequence returns to step S3 to perform programming again.

As described above, the quaternary data write operation always requires three verification operations for one programming. This makes the write time much longer than that for binary data.

Embodiments of the present invention having solved the above problem will be explained below. In the following explanation, the reference numerals denote the same parts throughout the drawing.

First Embodiment

First, a nonvolatile semiconductor memory of the first embodiment of the present invention will be explained below.

Figure 9:
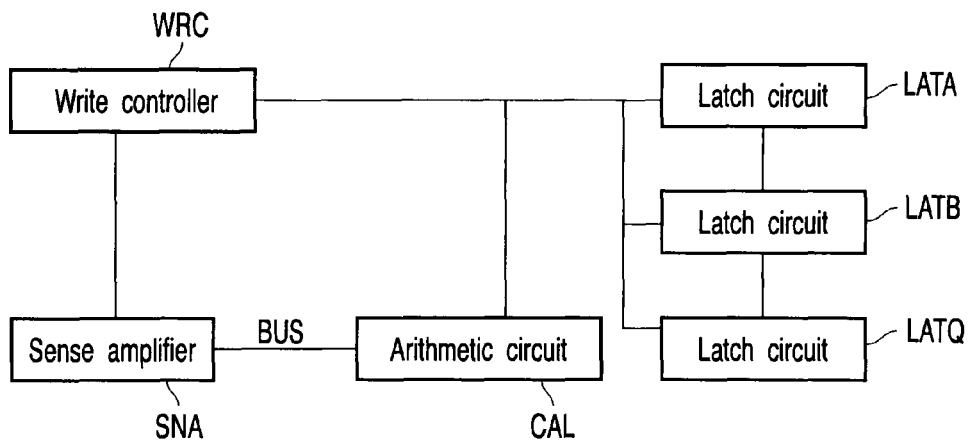
FIG. 9 is a block diagram showing the arrangement of a nonvolatile semiconductor memory according to the first embodiment of the present invention.

FIG. 9 is a block diagram showing the arrangement of the nonvolatile semiconductor memory according to the first embodiment. This memory comprises a sense amplifier SNA including a NAND cell similar to that for binary data shown in FIG. 2, latch circuits LATA and LATB for storing data for setting a voltage level to which a memory cell is to be written, a latch circuit LATQ for storing data for setting whether to perform write (e.g., quick pass write) in a memory cell by supplying a predetermined intermediate voltage to a bit line, an arithmetic circuit CAL for performing a calculation to determine whether a memory cell is written to a predetermined voltage level, and a write controller WRC for controlling a write operation by controlling the sense amplifier SNA, latch circuits LATA, LATB, and LATQ, and arithmetic circuit CAL. In other words, this memory comprises the latch circuits LATA and LATB for storing the number of writes to be performed using a write voltage for each memory cell, the latch circuit LATQ for storing data indicating whether to perform intermediate-voltage write by using an intermediate voltage lower than the write voltage after write is performed the number of times of write, the arithmetic circuit CAL for performing a calculation by using the data stored in the latch circuits LATA, LATB, and LATQ, and obtaining data for updating the data stored in the latch circuits LATA, LATB, and LATQ for each memory cell, the sense amplifier SNA for performing the above-mentioned write or intermediate-voltage write in accordance with the data stored in the latch circuits LATA, LATB, and LATQ for each memory cell, and the write controller WRC for controlling the operations of the latch circuits LATA, LATB, and LATQ, arithmetic circuit CAL, and sense amplifier SNA.

Figure 10:
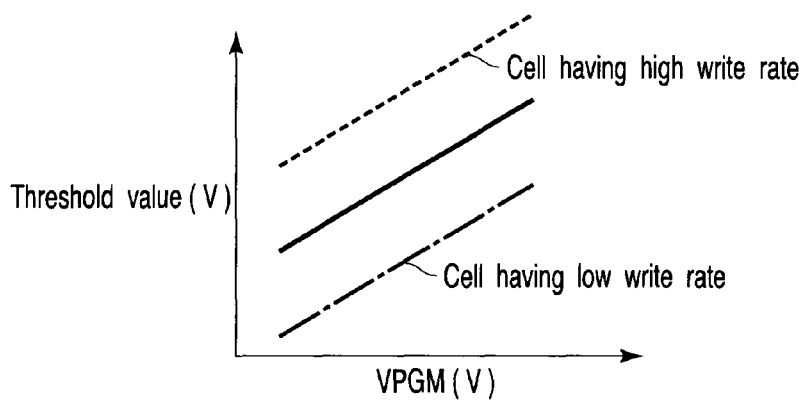
FIG. 10 is a graph showing the rises in threshold values of memory cells when data is written by a write voltage ($\Delta$VPGM)
Figure 11:
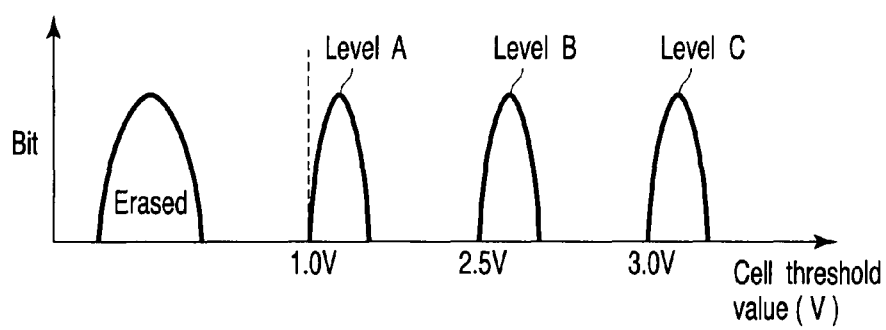
FIG. 11 is a graph showing the threshold distribution of a memory cell having quaternary data according to the first embodiment.

As shown in FIG. 10, the threshold rises ($\Delta Vth/\Delta VPGM$) with respect to a write voltage $\Delta VPGM$ are almost equal in all NAND cells. That is, when data is written in memory cells by $\Delta VPGM$, the rises in threshold values of the memory cells are almost equal regardless of the threshold values. In quaternary data as shown in FIG. 11, therefore, the number of programming operations for writing the threshold value of a memory cell to level B is $(V (\text{level B}) - V (\text{level A}))/(\Delta VPGM \times \alpha)$ after level-A verification. Assuming that $\Delta VPGM$ is 1.0 V, levels A, B, and C are respectively 1.0, 2.5, and 3.0 V as shown in FIG. 11, and $\alpha=1$, the number of programming operations for a write to level B is $(2.5-1.0)/1.0=1.5$ after level-A verification. Also, the number of programming operations for a write to level C is $(3.0-1.0)/1.0=2$. Since the number of programming operations for a write to level B is 1.5, i.e., a decimal, no data can be written to level B unless $\Delta VPGM$ is 0.5 V.

When writing data to level B, therefore, after write is performed once by the write voltage, the write rate is decreased by supplying an intermediate voltage lower than the write voltage and higher than the ground potential to the bit line when finally performing write corresponding to 0.5.

Figures 12, 13:
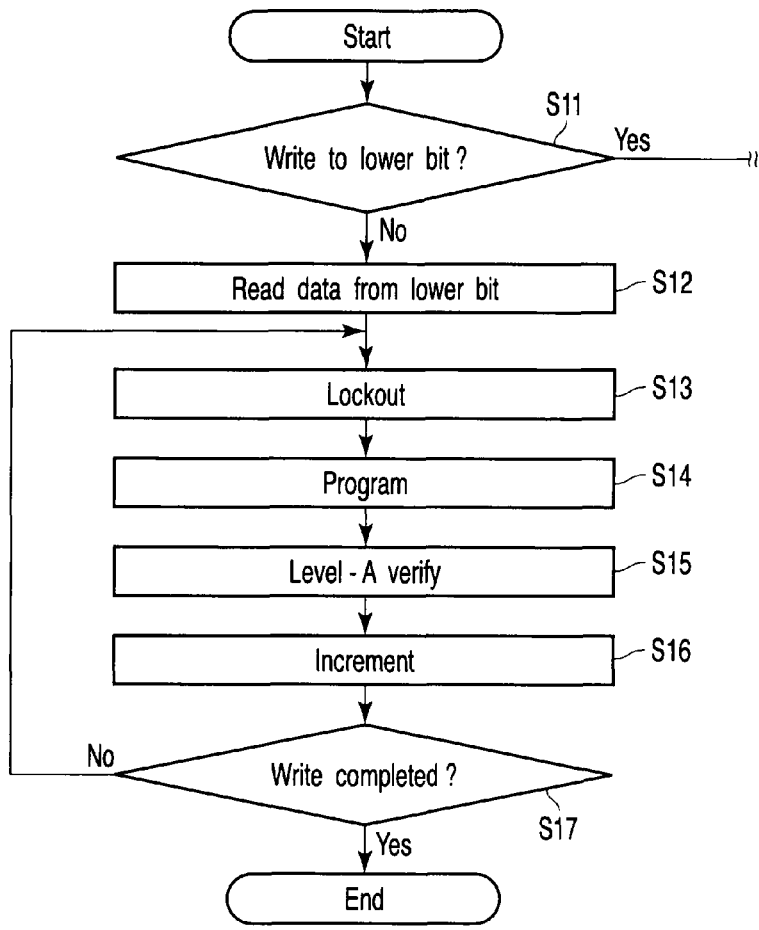
FIG. 12 is a flowchart showing a write sequence according to the first embodiment.
FIG. 13 is a view showing latch circuit stored data corresponding to the number of programming operations according to the first embodiment.

FIG. 12 is a flowchart showing a write sequence according to the first embodiment. The write controller WRC controls this write sequence.

When writing data in an upper bit, whether to write the data in a lower bit is first determined. If the data is to be written in a lower bit, the sequence advances to a step that is not shown. On the other hand, if the data is not to be written in a lower bit, the sequence advances to step S12 (step S11). In step S12, data is read from a lower bit. In lockout, write data is formed. For example, if the lower bit is 0 and the write data is 1, a level-A write is performed. As shown in FIG. 13, the number of programming operations is set in the latch circuits LATA and LATB for each write level. A 1 is placed in only the latch circuit LATQ corresponding to a bit for which the intermediate voltage is to be supplied to the bit line (step S13).

After data is thus placed in the latch circuits LATA, LATB, and LATQ, programming is performed (step S14). Subsequently, level-A verification is performed. For a bit having passed this verification, 1 is placed in the latch circuit SA of the sense amplifier SNA (step S15).

Then, a logic operation is performed between the latch circuit SA and the latch circuits LATA, LATB, and LATQ by using an algorithm as shown in FIG. 14, thereby incrementing the data in the latch circuits LATA, LATB, and LATQ. Note that b indicates inverted data. When the number of programming operations becomes zero, 1 indicating non-write is set as the data in the latch circuits LATA, LATB, and LATQ (step S16).

Subsequently, whether the latch circuits LATA, LATB, and LATQ corresponding to all bits are 1 is sensed. If the latch circuits LATA, LATB, and LATQ corresponding to all bits are 1, it is determined that data write is completed, so the write operation is terminated. On the other hand, if the latch circuits LATA, LATB, and LATQ corresponding to all bits are not 1, it is determined that data write is not completed. Accordingly, the sequence returns to step S13 to perform programming again (step S17).

In the first embodiment as described above, the verification operation need only be performed once in the write operation. In the nonvolatile semiconductor memory having quaternary data according to the first embodiment, therefore, the number of verification operations can be reduced from three to one, so the time required for the write operation can be shortened.

In addition, the latch circuit LATQ stores data indicating whether to write data by supplying the intermediate voltage lower than the write voltage to a bit line. This makes it possible to control write to a memory cell more finely than the write voltage.

Note that the first embodiment has been explained by taking quaternary data as an example, but this embodiment is also applicable to other multilevel data, e.g., data having 8 values, 16 values, ..., $2^n$ (n is a natural number of 3 or more) values. In any case, the number of verification operations can be reduced, so the time necessary for the write operation can be shortened.

Second Embodiment

A nonvolatile semiconductor memory of the second embodiment of the present invention will be explained below. The same reference numerals as in the first embodiment denote the same parts.

FIG. 15 is a block diagram showing the arrangement of the nonvolatile semiconductor memory according to the second embodiment. The difference from the arrangement of the first embodiment is that two latch circuits LATAQ and LATBQ store data indicating that intermediate-voltage write is performed by applying an intermediate voltage to a bit line.

FIG. 16 is a graph showing the set values of four verification levels of a memory cell according to the second embodiment. When writing the four values as shown in FIG. 16, data is stored in the latch circuits LATAQ and LATBQ and latch circuits LATA and LATB as shown in FIG. 17, and incremented by an algorithm as shown in FIG. 18 whenever programming is performed.

More specifically, in the quaternary data as shown in FIG. 16, the number of programming operations for writing the threshold value of a memory cell to level B is (V(level B)−V(level A))/(ΔVPGM×α) after level-A verification. Assuming that ΔVPGM is 1.0 V, levels A, B, and C are respectively 1.0, 2.6, and 3.0 V as shown in FIG. 16, and α=1, the number of programming operations for a write to level B is (2.6−1.0)/1.0=1.6 after level-A verification. Also, the number of programming operations for a write to level C is (3.0−1.0)/1.0=2. Since the number of programming operations for a write to level B is 1.6, i.e., a decimal, no data can be written to level B unless ΔVPGM is 0.6 V.

When writing data to level B, therefore, after write is performed once by a write voltage, write corresponding to 0.6 is performed by supplying an intermediate voltage lower than the write voltage and higher than the ground potential to a bit line. In this embodiment, intermediate-voltage write corresponding to 0.3 is performed twice, thereby writing the memory cell to level B.

In the second embodiment, the verification operation need only be performed once in the write operation as in the first embodiment. In the nonvolatile semiconductor memory having quaternary data according to the second embodiment, therefore, the number of verification operations can be reduced from three to one, so the time required for the write operation can be shortened.

In addition, the latch circuits LATAQ and LATBQ store the number of writes to be performed by supplying the intermediate voltage lower than the write voltage to a bit line. This makes it possible to control write to a memory cell more finely than the write voltage.

Note that similar to the first embodiment, the second embodiment has been explained by taking quaternary data as an example, but this embodiment is also applicable to other multilevel data, e.g., data having 8 values, 16 values, . . . , $2^n$ (n is a natural number of 3 or more) values. In any case, the number of verification operations can be reduced, so the time necessary for the write operation can be shortened.

Third Embodiment

A nonvolatile semiconductor memory of the third embodiment of the present invention will be explained below. The same reference numerals as in the second embodiment denote the same parts. In the third embodiment, quaternary data as shown in FIG. 19 is written by using the same circuit configuration as in the second embodiment shown in FIG. 15.

FIG. 19 shows the set values of four verification levels of a memory cell according to the third embodiment. When writing the four values as shown in FIG. 19, data is stored in latch circuits LATAQ, LATBQ, LATA, and LATB as shown in FIG. 20, and incremented by an algorithm as shown in FIG. 21 whenever programming is performed. Note that the latch circuit LATAQ stores 1 for only a bit for which the bit line voltage is set at 0.25 V, and the latch circuit LATBQ stores 1 for only a bit for which the bit line voltage is set at 0.5 V.

More specifically, in the quaternary data as shown in FIG. 19, the number of programming operations for writing the threshold value of a memory cell to level B is (V(level B)−V(level A))/(ΔVPGM×α) after level-A verification. Assuming that ΔVPGM is 1.0 V, levels A, B, and C are respectively 1.0, 2.25, and 3.5 V as shown in FIG. 19, and α=1, the number of programming operations for a write to level B is (2.25−1.0)/1.0=1.25 after level-A verification. Also, the number of programming operations for a write to level C is (3.5−1.0)/1.0=2.5. Since the number of programming operations for a write to level B is 1.25, i.e., a decimal, no data can be written to level B unless ΔVPGM is 0.25 V.

When writing data to level B, therefore, after write is performed once by a write voltage, write corresponding to 0.25 is performed by supplying an intermediate voltage lower than the write voltage and higher than the ground potential to a bit line. In this embodiment, intermediate-voltage write corresponding to 0.25 is performed once, thereby writing the memory cell to level B.

Also, when writing data to level C, after write is performed twice by the write voltage, write corresponding to 0.5 is performed by supplying an intermediate voltage lower than the write voltage and higher than the ground potential to a bit line. In this embodiment, intermediate-voltage write corresponding to 0.5 is performed once, thereby writing the memory cell to level C.

Figure 22:
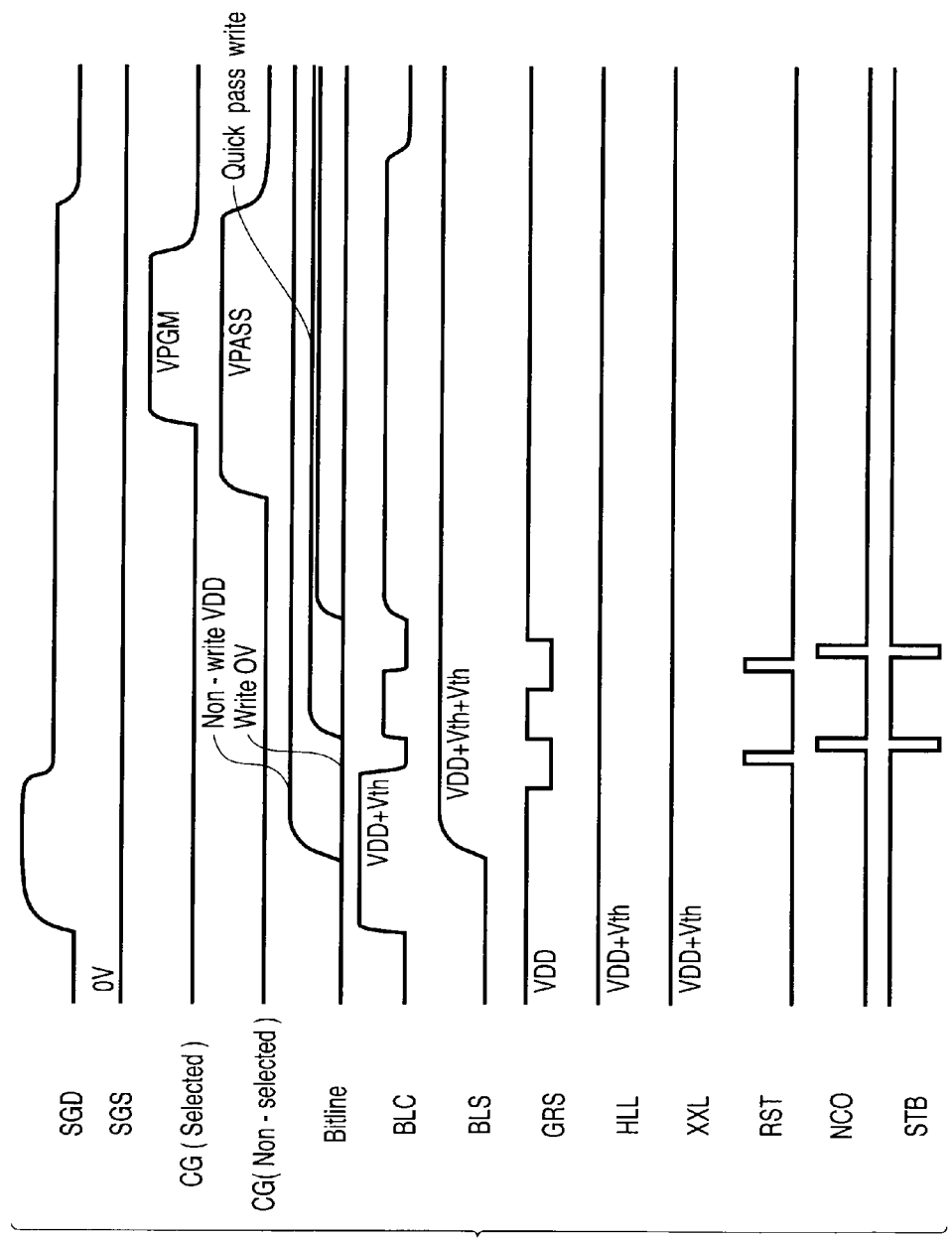
FIG. 22 is a timing chart when writing quaternary data according to the third embodiment.

FIG. 22 shows a timing chart of programming according to the third embodiment. The memory cell write level can be controlled more finely by changing the bit line potential to three stages, i.e., a power supply voltage VDD (non-write), 0.5 V, and 0.25 V.

In the third embodiment, the verification operation need only be performed once in the write operation as in the first embodiment. In the nonvolatile semiconductor memory having quaternary data according to the third embodiment, therefore, the number of verification operations can be reduced from three to one, so the time required for the write operation can be shortened.

In addition, the latch circuits LATAQ and LATBQ store data indicating whether to write data by supplying the two types of intermediate voltages lower than the write voltage to a bit line. This makes it possible to control write to a memory cell more finely than the write voltage.

Note that similar to the first embodiment, the third embodiment has been explained by taking quaternary data as an example, but this embodiment is also applicable to other multilevel data, e.g., data having 8 values, 16 values, . . . , $2^n$ (n is a natural number of 3 or more) values. In any case, the number of verification operations can be reduced, so the time necessary for the write operation can be shortened.

In the embodiments of the present invention, it is possible to reduce the number of verification operations required in multilevel write, and shorten the time necessary for the write operation.

Also, a nonvolatile semiconductor memory according to an embodiment of the present invention is a nonvolatile semiconductor memory for storing multilevel data having N (N=$2^n$, n is a natural number of 2 or more) values in a memory cell, characterized by comprising a plurality of electrically programmable memory cells, a plurality of latch circuits for storing, for each memory cell, the number of times of write to be performed using the write voltage, and a write controller which performs, (N−2) times or less, verification for checking whether each memory cell is on a predetermined verification level, causes first and second latch circuits to store the number of times of write to be performed using the write voltage after the verification, for each memory cell for which the verification is not performed and which is to be written to a voltage level higher than the verification level, reduces the number of times of write whenever write is performed by the write voltage, and decreases the change in threshold value of the memory cell by using an intermediate voltage lower than the write voltage in final write.

Each embodiment of the present invention can provide a nonvolatile semiconductor memory capable of reducing the number of verification operations when writing multilevel data in a memory cell, thereby shortening the write time.

Also, the above-mentioned embodiments can be practiced singly, and can also be practiced as they are appropriately combined. In addition, these embodiments include inventions in various stages. Accordingly, these inventions in various stages can be extracted by appropriately combining the constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a plurality of electrically programmable memory cells;
a first latch circuit and a second latch circuit which store the number of times of write to be performed using a write voltage for each memory cell;
a third latch circuit which stores data indicating whether to perform write by using an intermediate voltage lower than the write voltage;
a fourth latch circuit which stores, for each memory cell, data indicating whether the memory cell has passed predetermined verification;
an arithmetic circuit which, whenever write is performed by one of the write voltage and the intermediate voltage, performs a calculation by using the data stored in the first latch circuit, the second latch circuit, the third latch circuit, and the fourth latch circuit, and updates the data stored in the first latch circuit, the second latch circuit, and the third latch circuit;
a sense amplifier which performs write by one of the write voltage and the intermediate voltage for each memory cell, in accordance with the data stored in the first latch circuit, the second latch circuit, and the third latch circuit; and
a write controller which controls operations of the first latch circuit, the second latch circuit, the third latch circuit, the fourth latch circuit, the arithmetic circuit, and the sense amplifier,
wherein the write controller performs predetermined verification for each memory cell, and stores data indicating whether the memory cell has passed the predetermined verification in the fourth latch circuit,
stores the number of times of write to be performed by the write voltage after the verification in the first latch circuit and the second latch circuit, and stores data indicating whether to perform write by the intermediate voltage in the third latch circuit, for a memory cell to be written to a voltage level higher than a voltage level of the predetermined verification,
updates the number of times of write stored in the first latch circuit and the second latch circuit, whenever write is performed by the write voltage, and
determines write by the intermediate voltage in accordance with the data stored in the third latch circuit, after write is performed the number of times of write by the write voltage.

2. The memory according to claim 1, wherein a rise in threshold value of the memory cell when write is performed by the intermediate voltage is smaller than that when write is performed by the write voltage.

3. The memory according to claim 1, wherein the plurality of memory cells each store multilevel data having N ($N=2^n$, n is a natural number of 2 or more) values.

4. The memory according to claim 1, wherein the plurality of memory cells are connected in series by current paths thereof, selection gate transistors are connected to one terminal and the other terminal of a series circuit of the plurality of memory cells, and the plurality of memory cells and the selection gate transistors form a NAND cell.

5. A nonvolatile semiconductor memory comprising:
a plurality of electrically programmable memory cells;
a first latch circuit and a second latch circuit which store the number of times of write to be performed using a write voltage for each memory cell;
a third latch circuit and a fourth latch circuit which store the number of times of write to be performed using an intermediate voltage lower than the write voltage;
a fifth latch circuit which stores, for each memory cell, data indicating whether the memory cell has passed predetermined verification;
an arithmetic circuit which, whenever write is performed by one of the write voltage and the intermediate voltage, performs a calculation by using the data stored in the first latch circuit, the second latch circuit, the third latch circuit, the fourth latch circuit, and the fifth latch circuit, and updates the data stored in the first latch circuit, the second latch circuit, the third latch circuit, and the fourth latch circuit;
a sense amplifier which performs write by one of the write voltage and the intermediate voltage for each memory cell, in accordance with the data stored in the first latch circuit, the second latch circuit, the third latch circuit, and the fourth latch circuit; and
a write controller which controls operations of the first latch circuit, the second latch circuit, the third latch circuit, the fourth latch circuit, the fifth latch circuit, the arithmetic circuit, and the sense amplifier,
wherein the write controller performs predetermined verification for each memory cell, and stores data indicating whether the memory cell has passed the predetermined verification in the fifth latch circuit,
stores the number of times of write to be performed by the write voltage after the verification in the first latch circuit and the second latch circuit, and stores the number of times of write to be performed by the intermediate voltage in the third latch circuit and the fourth latch circuit, for a memory cell to be written to a voltage level higher than a voltage level of the predetermined verification,
updates the number of times of write stored in the first latch circuit and the second latch circuit, whenever write is performed by the write voltage, and
performs write by the intermediate voltage in accordance with the number of times of write stored in the third latch circuit and the fourth latch circuit, after write is performed the number of times of write by the write voltage.

6. The memory according to claim 5, wherein a rise in threshold value of the memory cell when write is performed by the intermediate voltage is smaller than that when write is performed by the write voltage.

7. The memory according to claim 5, wherein the plurality of memory cells each store multilevel data having N ($N=2^n$, n is a natural number of 2 or more) values.

8. The memory according to claim 5, wherein the plurality of memory cells are connected in series by current paths thereof, selection gate transistors are connected to one terminal and the other terminal of a series circuit of the plurality of memory cells, and the plurality of memory cells and the selection gate transistors form a NAND cell.

9. A nonvolatile semiconductor memory comprising:
a plurality of electrically programmable memory cells;
a first latch circuit and a second latch circuit which store the number of times of write to be performed using a write voltage for each memory cell;
a third latch circuit which stores the number of times of write to be performed using a first intermediate voltage lower than the write voltage;
a fourth latch circuit which stores the number of times of write to be performed using a second intermediate voltage lower than the write voltage and higher than the first intermediate voltage;
a fifth latch circuit which stores, for each memory cell, data indicating whether the memory cell has passed predetermined verification;
an arithmetic circuit which, whenever write is performed by one of the write voltage, the first intermediate voltage, and the second intermediate voltage, performs a calculation by using the data stored in the first latch circuit, the second latch circuit, the third latch circuit, the fourth latch circuit, and the fifth latch circuit, and updates the data stored in the first latch circuit, the second latch circuit, the third latch circuit, and the fourth latch circuit;
a sense amplifier which performs write by one of the write voltage, the first intermediate voltage, and the second intermediate voltage for each memory cell, in accordance with the data stored in the first latch circuit, the second latch circuit, the third latch circuit, and the fourth latch circuit; and
a write controller which controls operations of the first latch circuit, the second latch circuit, the third latch circuit, the fourth latch circuit, the fifth latch circuit, the arithmetic circuit, and the sense amplifier,
wherein the write controller performs predetermined verification for each memory cell, and stores data indicating whether the memory cell has passed the predetermined verification in the fifth latch circuit,
stores the number of times of write to be performed by the write voltage after the verification in the first latch circuit and the second latch circuit, stores the number of times of write to be performed by the first intermediate voltage in the third latch circuit, and stores the number of times of write to be performed by the second intermediate voltage in the fourth latch circuit, for a memory cell to be written to a voltage level higher than a voltage level of the predetermined verification,
updates the number of times of write stored in the first latch circuit and the second latch circuit, whenever write is performed by the write voltage, and
performs write by at least one of the first intermediate voltage and the second intermediate voltage in accordance with the numbers of times of write stored in the third latch circuit and the fourth latch circuit, after write is performed the number of times of write by the write voltage.

10. The memory according to claim 9, wherein a rise in threshold value of the memory cell when write is performed by the first intermediate voltage is smaller than that when write is performed by the write voltage, and a rise in threshold value of the memory cell when write is performed by the second intermediate voltage is smaller than that when write is performed by the write voltage, and larger than that when write is performed by the first intermediate voltage.

11. The memory according to claim 9, wherein the plurality of memory cells each store multilevel data having N ($N=2^n$, n is a natural number of 2 or more) values.

12. The memory according to claim 9, wherein the plurality of memory cells are connected in series by current paths thereof, selection gate transistors are connected to one terminal and the other terminal of a series circuit of the plurality of memory cells, and the plurality of memory cells and the selection gate transistors form a NAND cell.

* * * * *